(12) United States Patent
Takahama

(10) Patent No.: US 8,018,273 B2
(45) Date of Patent: Sep. 13, 2011

(54) FILTER CIRCUIT

(75) Inventor: Koji Takahama, Neyagawa (JP)

(73) Assignee: Onkyo Corporation, Neyagawa-shi (JP)

( * ) Notice: Subject to any disclaimer, the term of this patent is extended or adjusted under 35 U.S.C. 154(b) by 0 days.

(21) Appl. No.: 12/883,326

(22) Filed: Sep. 16, 2010

(65) Prior Publication Data

US 2011/0148512 A1 Jun. 23, 2011

(30) Foreign Application Priority Data

Dec. 21, 2009 (JP) .................................. 2009-288785

(51) Int. Cl.
*H03H 19/00* (2006.01)
*H03F 1/26* (2006.01)

(52) U.S. Cl. ......... 327/558; 455/307; 455/312; 333/176

(58) Field of Classification Search .................. None
See application file for complete search history.

(56) References Cited

U.S. PATENT DOCUMENTS

| | | | | |
|---|---|---|---|---|
| 4,926,135 | A * | 5/1990 | Voorman ..................... | 330/107 |
| 5,424,675 | A | 6/1995 | Matsushita | |
| 6,107,871 | A * | 8/2000 | Shin ............................ | 327/558 |
| 6,344,773 | B1 * | 2/2002 | Sevastopoulos et al. ..... | 327/558 |
| 6,816,004 | B2 * | 11/2004 | Easwaran et al. ............ | 327/552 |

FOREIGN PATENT DOCUMENTS

| | | |
|---|---|---|
| JP | 01-202914 | 8/1989 |
| JP | 05-022077 | 1/1993 |
| JP | 05-335838 | 12/1993 |
| JP | 06-061853 | 3/1994 |
| JP | 07-283690 | 10/1995 |
| JP | 09-266417 | 10/1997 |

OTHER PUBLICATIONS

Analog Input Buffer Architectures, Cirrus Logic Application Note AN241, Rev. 1, Oct. 2003 (http://www.cirrus.com/en/pubs/appNote/an241-1.pdf).

* cited by examiner

*Primary Examiner* — Lincoln Donovan
*Assistant Examiner* — Terry L Englund
(74) *Attorney, Agent, or Firm* — Renner, Otto, Boisselle & Sklar, LLP

(57) ABSTRACT

A filter circuit that removes high-frequency components from an input signal, comprises: an operational amplifier; a first resistor connected between a non-inverting input terminal of the operational amplifier and an input signal source; a first capacitor connected to the non-inverting input terminal of the operational amplifier; a second resistor connected to the non-inverting input terminal of the operational amplifier; a third resistor connected between an inverting input terminal of the operational amplifier and the input signal source; a second capacitor connected between the inverting input terminal of the operational amplifier and an output terminal of the operational amplifier; and a fourth resistor connected to the inverting input terminal of the operational amplifier.

1 Claim, 7 Drawing Sheets

FILTER CIRCUIT

BACKGROUND OF THE INVENTION

1. Field of the Invention

The present invention relates to a filter circuit capable of removing common mode noise.

2. Description of the Related Art

FIG. 6 is a circuit diagram showing a conventional low-pass filter circuit 21 called an anti-aliasing filter. The low-pass filter 21 is provided at a previous stage of an ADC (Analog/Digital Converter) to remove high-frequency components (unnecessary signals other than a sampling frequency) from an audio signal inputted to the ADC. However, in the low-pass filter circuit 21, there is a problem that when common mode noise occurs between a ground line connected between a ground GND (AN) connected to an input signal source and a ground GND (AD) connected to the ADC, and an audio signal line between the input signal source and input terminals of the ADC, the common mode noise is superimposed on the audio signal inputted to the ADC. The GND (AN) is an analog ground, and the GND (AD) is a ground of the ADC.

On the other hand, in Japanese Patent Application Laid-Open No. 6-61853, a circuit that removes common mode noise is described. In this literature, there is described a technique of interposing, in a signal output system from a D/A converting unit to an analogy system, differential amplification means A1 with a level of a ground line GNDA used as a reference level to remove an in-phase noise component. Moreover, in Japanese Patent Application Laid-Open No. 9-266417, a ground isolation circuit is described.

Here, if the low-pass filter circuit 21 in FIG. 6 is configured so that the differential amplification means or the isolation circuit described in their Patent Literatures are simply combined to thereby remove the common mode noise, the number of operational amplifiers is disadvantageously increased (i.e., the number of operational amplifiers is increased by that of the operational amplifier as the differential amplification means), resulting in increases in circuit size and cost.

SUMMARY OF THE INVENTION

An object of the present invention is to provide a filter circuit capable of removing common mode noise without increasing a circuit size.

According to a preferred embodiment of the present invention, a filter circuit that removes high-frequency components from an input signal, comprises: an operational amplifier; a first resistor connected between a non-inverting input terminal of the operational amplifier and an input signal source; a first capacitor connected to the non-inverting input terminal of the operational amplifier; a second resistor connected to the non-inverting input terminal of the operational amplifier; a third resistor connected between an inverting input terminal of the operational amplifier and the input signal source; a second capacitor connected between the inverting input terminal of the operational amplifier and an output terminal of the operational amplifier; and a fourth resistor connected to the inverting input terminal of the operational amplifier, wherein a resistance value of the first resistor and a resistance value of the third resistor are set to be equal, a capacitance value of the first capacitor and a capacitance value of the second capacitor are set to be equal, and a resistance value of the second resister and a resistance value of the fourth resister are set to be equal, by which the operational amplifier, the first to fourth resistors and the first and second capacitors, which constitute the filter circuit, function as a ground isolation circuit as well.

With the above-described configuration, while maintaining the function as the low-pass filter, a connection configuration of the elements connected to the inverting input terminal side of the operational amplifier and a connection configuration of the elements connected to the non-inverting input terminal side of the operational amplifier can be made symmetrical, and as a result, the filter circuit can realize the function as the ground isolation circuit (differential amplification circuit) as well. Accordingly, the only one operational amplifier allows both the function as the filter circuit and the function as the ground isolation circuit to be achieved, by which the filter circuit capable of removing the common mode noise without increasing a circuit size can be provided.

In a preferred embodiment, a third capacitor is connected between the first resistor and the input signal source, a fourth capacitor is connected between the third resistor and the input signal source, and a capacitance value of the third capacitor and a capacitance value of the fourth capacitor are set to be equal.

In this case, an additional effect of removing low-frequency noise included in the input signal can be obtained.

DETAILED DESCRIPTION OF THE PREFERRED EMBODIMENTS

Figure 1:
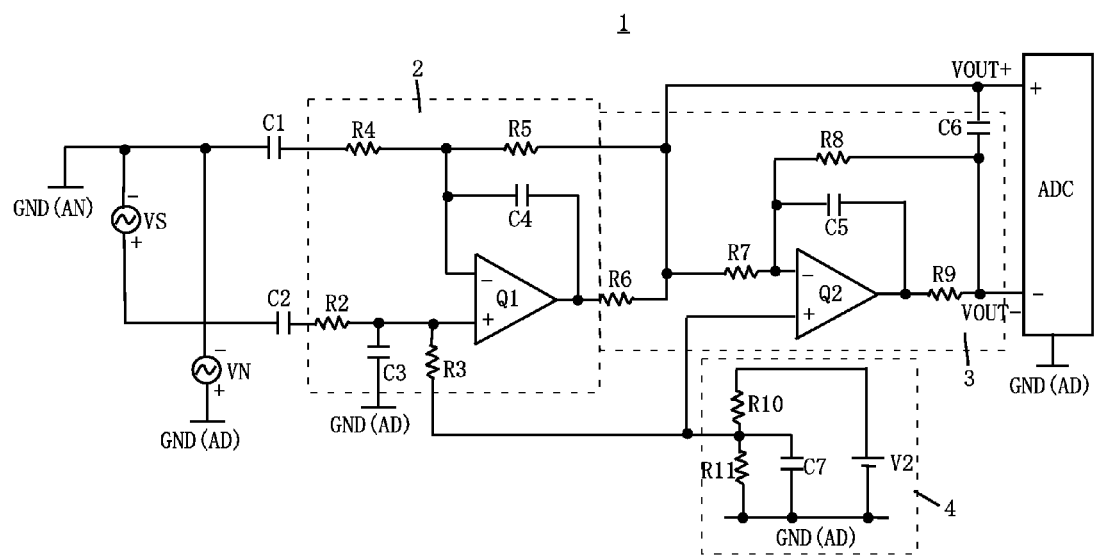
FIG. 1 is a circuit diagram showing a filter circuit 1 according to a preferred embodiment of the present invention.

Hereinafter, while a filter circuit 1 according to preferred embodiments of the present invention is described, the present invention is not limited to these embodiments. FIG. 1 is a circuit diagram showing the filter circuit 1. The filter circuit 1 is a circuit that is provided at a previous stage of a differential input type ADC (Analog/Digital Converter) to remove high-frequency components from an input audio signal. That is, the filter circuit 1 is a circuit in which a low-pass filter circuit called as an anti-aliasing filter is improved.

Figure 1B:
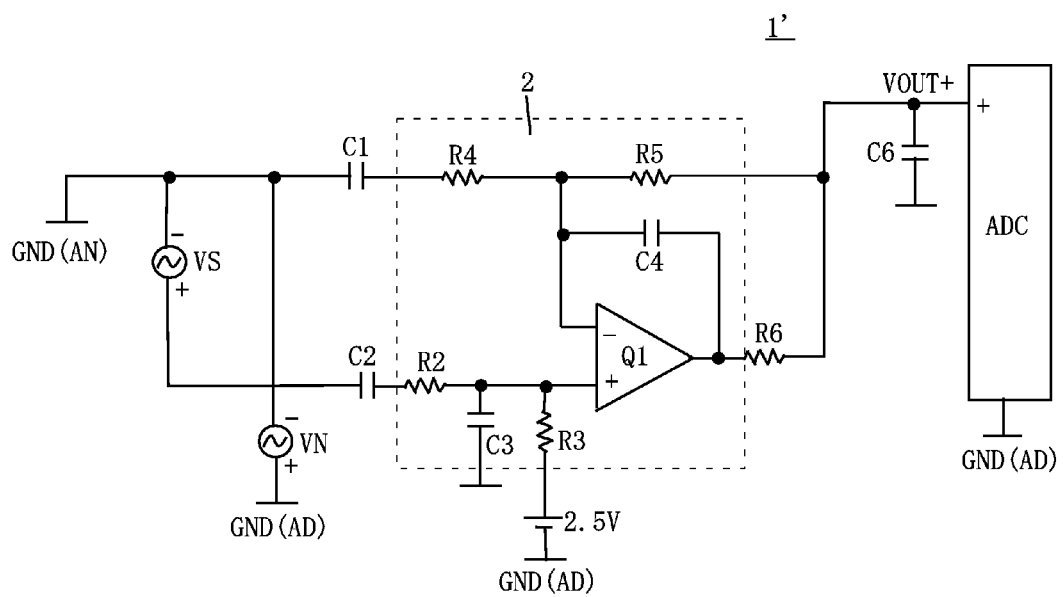
FIG. 1B is a circuit diagram showing a filter circuit 1' according to a preferred embodiment of the present invention.

The filter circuit 1 includes a first filter circuit 2, a second filter circuit 3, a bias circuit 4, and other peripheral circuits. The first filter circuit 2 is a circuit that removes high-frequency components from an input audio signal VS and generates a positive-side output audio signal VOUT+ to be inputted to a positive-side input terminal of the ADC. The second filter circuit 3 is a circuit that removes high-frequency components from the input audio signal VS and generates a negative-side output audio signal VOUT− to be inputted to a negative-side input terminal of the ADC. That is, the second filter circuit 3 inverts the positive-side output audio signal VOUT+ outputted from the first filter circuit 2 to generate the negative-side output audio signal VOUT−. The bias circuit 4 is a circuit that generates a bias voltage (e.g., 2.5 V) from a power-supply voltage V2 to supply the bias voltage to respective non-inverting input terminals of operational amplifiers Q1, Q2. For the present invention, only the first filter circuit 2 is essential, and the second filter circuit 3 and the bias circuit 4 are not essential. That is, when the ADC is not of a differential input type, a filter circuit 1' including only the first filter circuit 2 as shown in FIG. 1B may be used.

The first filter circuit 2 has, in addition to a function as a low-pass filter, a function as a ground isolation circuit. That is, the one operational amplifier Q1 allows the function as the low-pass filter and the function as the ground isolation circuit (i.e., the operational amplifier Q1 operates as a differential amplification circuit) to be realized. As the function as the ground isolation circuit, an in-phase component of a signal inputted to an inverting input terminal of the operational amplifier Q1 and a signal inputted to the non-inverting input terminal of the operational amplifier Q1 is removed (offset) to thereby remove common mode noise occurring between a ground line connected between a ground GND (AN) connected to the input audio signal source VS and a ground GND (AD) connected to the ADC, and an audio signal line between the input audio signal source and the input terminals of the ADC. In FIG. 1, a signal source VN indicates a signal source of the common mode noise.

Figure 6:
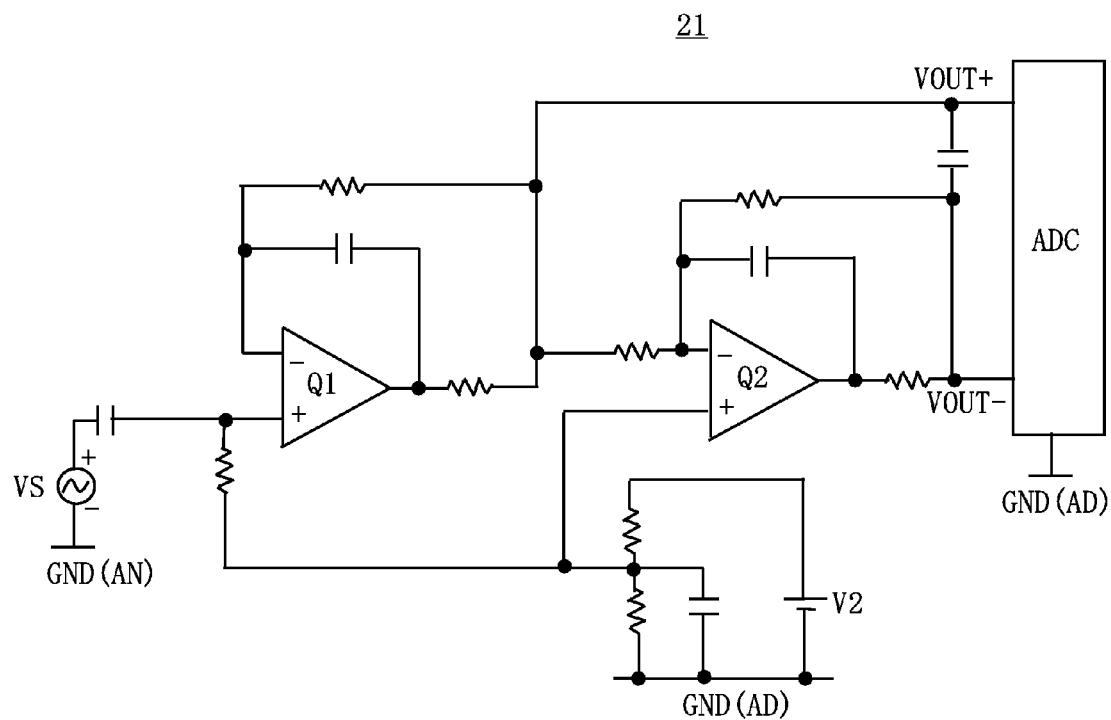
FIG. 6 is a circuit diagram showing the conventional filter circuit 21.

The first filter circuit 2 includes the operational amplifier Q1, resistors R2 to R5, and capacitors C3, C4. That is, as compared with the filter circuit 21 in FIG. 6, in the first filter circuit 2, the resistors R2, R4 and the capacitor C3 are added, which makes symmetrical a connection configuration of the elements connected to the inverting input terminal side of the operational amplifier Q1 and a connection configuration of the elements connected to the non-inverting input terminal side of the operational amplifier Q1. As a result, the first filter circuit 2 has the function as the ground isolation circuit (differential amplification circuit) in addition to the function as the low-pass filter.

The non-inverting input terminal of the operational amplifier Q1 is connected to one end of each of the resistors R2, R3 and the capacitor C3, while the inverting input terminal of the operational amplifier Q1 is connected to one end of each of the resistors R4, R5 and the capacitor C4, and an output terminal of the operational amplifier Q1 is connected to another end of the capacitor C4, and is also connected to another end of the resistor R5 and the positive-side input terminal of the ADC through the resistor R6. Another end of the resistor R4 is connected to a negative side of the input audio signal source VS through a capacitor C1 and is further connected to a ground. Another end of the resistor R2 is connected to a positive side of the input audio signal source VS through a capacitor C2. Another end of the capacitor C3 is connected to a ground. Another end of the resistor R3 is connected to the non-inverting input terminal of the operational amplifier Q2 of the second filter circuit 3, and is connected to resistors R10, R11, and a capacitor C7 of the bias circuit 4.

In order for the first filter circuit 2 to realize the function as the ground isolation circuit, a resistance value of the resistor R2 and a resistance value of the resistor R4 are set to be equal (e.g., 10 kΩ), a resistance value of the resistor R3 and a resistance value of the resistor 5 are set to be equal (e.g., 10 kΩ), and a capacitance value of the capacitor C3 and a capacitance value of the capacitor C4 are set to be equal (e.g., 47 pF).

In a more preferable embodiment, a capacitance value of the capacitor C1 and a capacitance value of the capacitor C2 are set to be equal (e.g., 47 µF). In this case, an additional effect of removing low-frequency noise components from the input audio signal can be also obtained.

Figure 2:
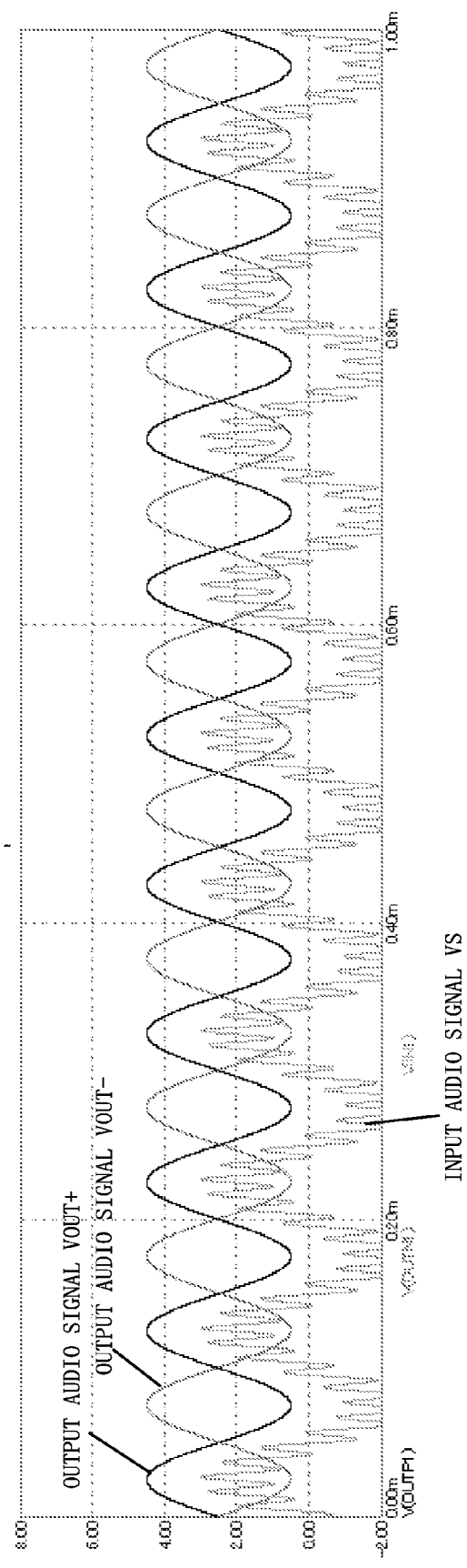
FIG. 2 is a measurement result showing an output audio signal of the filter circuit 1 in FIG. 1.

Hereinafter, an effect obtained by the filter circuit 1 of the present invention is described. FIG. 2 illustrates data showing that the filter circuit 1 in FIG. 1 functions as the ground isolation circuit. FIG. 2 shows a measurement result indicating the positive-side output audio signal VOUT+ and the negative-side output audio signal VOUT− in comparison to the input audio signal VS of the filter circuit 1 on FIG. 1. As shown in FIG. 2, it is found that the common mode noise superimposed on the input audio signal VS is removed, thereby resulting in smooth analog waveforms.

Figure 3:
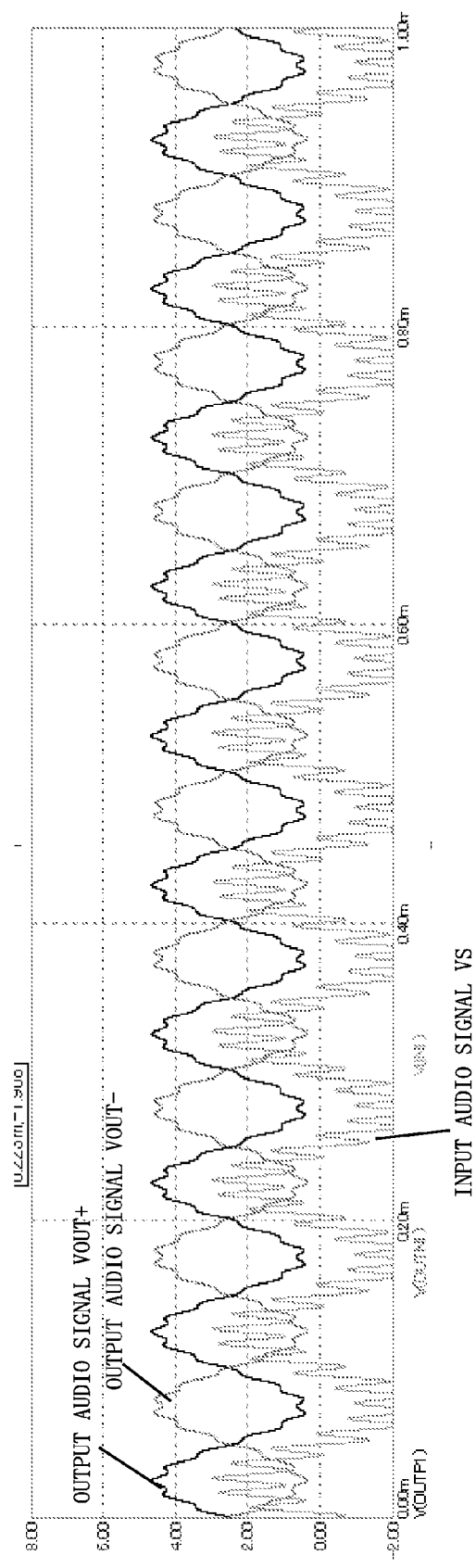
FIG. 3 is a measurement result indicating an output audio signal of a filter circuit 11 of a comparative example in FIG. 4.
Figure 4:
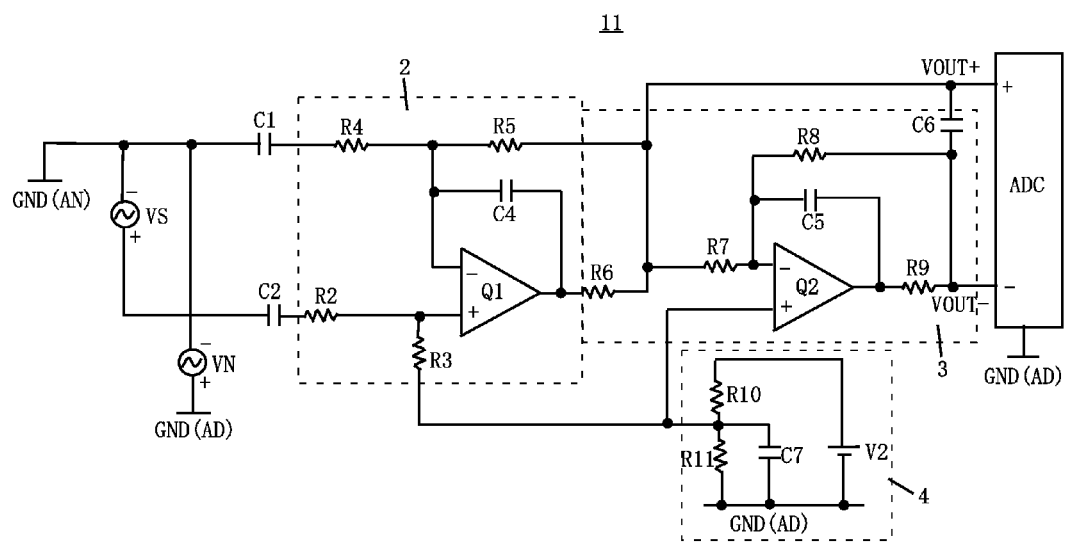
FIG. 4 is a circuit diagram showing the filter circuit 11 of the comparative example in which a capacitor C3 is removed from the filter circuit 1 in FIG. 1.

FIG. 3 shows a measurement result indicating the positive-side output audio signal VOUT+ and the negative-side output audio signal VOUT− in comparison to the input audio signal VS of a filter circuit 11 in FIG. 4 as a comparative example. In the filter circuit 11 in FIG. 4, the capacitor C3 is deleted as compared with the filter circuit 1 in FIG. 1. Since the capacitor C3 is not included, on the inverting input terminal side of the operational amplifier Q1, frequency characteristics are deteriorated by influence of the capacitor C4, and in contrast, on the non-inverting input terminal side, the frequency characteristics are flat, exhibiting imbalance in differential. As a result, as shown in FIG. 3, the common mode noise superimposed on the input audio signal VS cannot be sufficiently removed, and the common mode noise is included in the output audio signal, so that smooth analog waveforms cannot be obtained.

Figure 5:
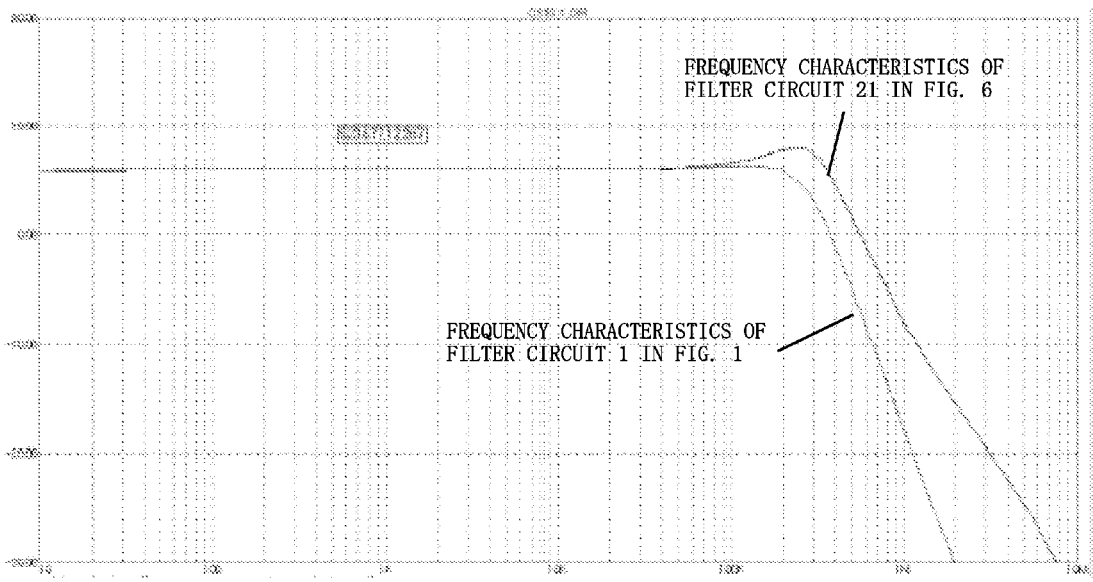
FIG. 5 is a frequency characteristic diagram of the filter circuit 1 in FIG. 1 and a conventional filter circuit 21 in FIG. 6.

FIG. 5 shows a measurement result indicating that the filter circuit 1 in FIG. 1 functions as the low-pass filter. FIG. 5 shows a result from measuring a frequency-sound pressure level of the first circuit 1 in FIG. 1 and the conventional filter circuit 21 in FIG. 6. As shown in FIG. 5, it is found that the filter circuit 1 in FIG. 1 can sufficiently remove the high-frequency components of the audio signal.

As described above, according to the present invention, since the first filter circuit 2 has the above-described configuration, the single operational amplifier Q1 allows the first filter circuit 2 to perform the function as the low-pass filter and the function as the ground isolation circuit.

While the preferred embodiments of the present invention have been described in the foregoing, the present invention is not limited to these embodiments. The input signal is not limited to the audio signal, but the present invention can be applied to a video signal or other arbitrary signals. The resistor R3 may be connected to a power source instead of being connected to the bias circuit, as shown in FIG. 1B.

What is claimed is:

1. A filter circuit that is provided at a previous stage of a differential input type Analog/Digital Converter to remove high-frequency components from an input signal, comprising:
    a first filter circuit generating a positive-side output signal from the input signal to be inputted to a positive-side input terminal of the Analog/Digital Converter; and
    a second filter circuit inverting the positive-side output signal to generate a negative-side output signal to be inputted to a negative-side input terminal of the Analog/Digital Converter; wherein
    the first filter circuit includes,
        a first operational amplifier;
        a first resistor whose one end is connected to a non-inverting input terminal of the first operational amplifier and whose another end is connected to a positive-side of an input signal source;

a first capacitor whose one end is connected to the non-inverting input terminal of the first operational amplifier and whose another end is connected to a ground potential;

a second resistor whose one end is connected to the non-inverting input terminal of the first operational amplifier and whose another end is connected to a predetermined potential;

a third resistor whose one end is connected to an inverting input terminal of the first operational amplifier and whose another end is connected to a negative-side of the input signal source;

a second capacitor whose one end is connected to the inverting input terminal of the first operational amplifier and whose another end is connected to an output terminal of the first operational amplifier; and a fourth resistor whose one end is connected to the inverting input terminal of the first operational amplifier and whose another end is connected to the positive-side input terminal of the Analog/Digital Converter, wherein a resistance value of the first resistor and a resistance value of the third resistor are set to be equal, a capacitance value of the first capacitor and a capacitance value of the second capacitor are set to be equal, and a resistance value of the second resistor and a resistance value of the fourth resistor are set to be equal, by which the first operational amplifier, the first to fourth resistors and the first and second capacitors, which constitute the first filter circuit, function as a ground isolation circuit as well, and the second filter circuit includes, a second operational amplifier whose non-inverting input terminal is connected to the predetermined potential;

a fifth resistor whose one end is connected to the output terminal of the first operational amplifier and whose another end is connected to the positive-side input terminal of the Analog/Digital Converter;

a sixth resistor whose one end is connected to the another end of the fifth resistor and whose another end is connected to the inverting input terminal of the second operational amplifier;

a seventh resistor whose one end is connected to the inverting input terminal of the second operational amplifier and whose another end is connected to the negative-side input terminal of the Analog/Digital Converter;

an eighth resistor whose one end is connected to the output terminal of the second operational amplifier and whose another end is connected to the negative-side input terminal of the Analog/Digital Converter;

a third capacitor whose one end is connected to the inverting input terminal of the second operational amplifier and whose another end is connected to the output terminal of the second operational amplifier; and a fourth capacitor whose one end is connected to the positive-side input terminal of the Analog/Digital Converter and whose another end is connected to the negative-side input terminal of the Analog/Digital Converter.

* * * * *